(12) United States Patent
Ben Shem et al.

(10) Patent No.: US 11,133,819 B2
(45) Date of Patent: Sep. 28, 2021

(54) LOOKUP-TABLE-BASED SIGMA-DELTA ADC FILTER

(71) Applicant: Sony Semiconductor Solutions Corporation, Kanagawa (JP)

(72) Inventors: Ariel Ben Shem, Hasharon (IL); Itai Shvartz, Petach-Tikva (IL)

(73) Assignee: Sony Semiconductor Solutions Corporation, Kanagawa (JP)

( * ) Notice: Subject to any disclaimer, the term of this patent is extended or adjusted under 35 U.S.C. 154(b) by 188 days.

(21) Appl. No.: 16/058,482

(22) Filed: Aug. 8, 2018

(65) Prior Publication Data

US 2019/0356328 A1 Nov. 21, 2019

Related U.S. Application Data

(60) Provisional application No. 62/672,893, filed on May 17, 2018.

(51) Int. Cl.
*H04N 5/369* (2011.01)
*H03M 3/00* (2006.01)
*H04N 5/378* (2011.01)

(52) U.S. Cl.
CPC .............. *H03M 3/32* (2013.01); *H03M 3/458* (2013.01); *H04N 5/3698* (2013.01); *H04N 5/378* (2013.01)

(58) Field of Classification Search
CPC ...... H03M 3/32; H03M 3/458; H04N 5/3698; H04N 5/378
See application file for complete search history.

(56) References Cited

U.S. PATENT DOCUMENTS

| | | | | |
|---|---|---|---|---|
| 5,952,947 | A * | 9/1999 | Nussbaum | H03M 3/392 341/143 |
| 6,414,615 | B1 * | 7/2002 | Cheng | H03M 3/37 341/143 |
| 2009/0237282 | A1 * | 9/2009 | Hartlieb | G05B 11/36 341/143 |
| 2013/0057744 | A1 * | 3/2013 | Minagawa | H04N 5/35563 348/311 |
| 2016/0006452 | A1 * | 1/2016 | Saito | G01R 19/2509 348/302 |

\* cited by examiner

*Primary Examiner* — Que Tan Le
*Assistant Examiner* — Don J Williams
(74) *Attorney, Agent, or Firm* — Michael Best & Friedrich LLP

(57) ABSTRACT

An analog-to-digital converter comprises a sigma-delta modulator; and an ADC filter configured to store a plurality of partial sums as respective entries in a plurality of lookup tables, retrieve at least one of the plurality of partial sums based on an output of the sigma-delta modulator, and calculate a filter output by adding retrieved ones of the plurality of partial sums together.

20 Claims, 14 Drawing Sheets

LOOKUP-TABLE-BASED SIGMA-DELTA ADC FILTER

BACKGROUND OF THE INVENTION

1. Field of the Invention

This application relates generally to analog-to-digital conversion. More specifically, this application relates to a system and method for calculating an output from a sigma-delta analog-to-digital converter that minimizes peak power consumption.

2. Description of Related Art

Image sensing devices typically consist of an image sensor, generally an array of pixel circuits, as well as signal processing circuitry and any associated control or timing circuitry. Within the image sensor itself, charge is collected in a photoelectric conversion device of the pixel circuit as a result of the impingement of light and an electrical signal is generated therefrom. The electrical signal is routed through a collection of analog readout circuits, which may comprise signal amplifiers, signal condition circuits, vertical signal lines (VSLs), sample and hold (S/H) circuits, and analog-to-digital converters (ADCs). Among other operations, the signals from the VSLs are sampled and then converted into digital values by ADCs.

In an image sensor, there are typically a very large number of individual photoelectric conversion devices (e.g. tens of millions), and many ADCs working in parallel. Each ADC in the image sensor is shared by a large number of photoelectric conversion devices; for example, a column or multiple columns of photoelectric conversion devices may share a single ADC, a rectangular block of photoelectric conversion devices may share an ADC, and the like. As the number of pixels in the image sensor increases, the number of ADCs also increases. As a result, the power consumption of the ADCS becomes an increasingly large factor as the image resolution (i.e., number of pixels) increases. As the total power consumption in an image sensor in a mobile device increases, not only is there an increase in the power drawn from a battery and resultant decrease in operating time of the mobile device, but there is also an increase in the temperature of the silicon and resultant degradation in the noise performance of the sensor. Accordingly, there exists a need to improve the power consumption characteristics of an image sensor that uses sigma-delta ADCs.

BRIEF SUMMARY OF THE INVENTION

Various aspects of the present disclosure relate to processing pixels of an image sensor with reduced peak power consumption.

In one exemplary aspect of the present disclosure, there is provided an analog-to-digital converter, comprising a sigma-delta modulator; and an ADC filter configured to store a plurality of partial sums as respective entries in a plurality of lookup tables, retrieve at least one of the plurality of partial sums based on an output of the sigma-delta modulator, and calculate a filter output by adding retrieved ones of the plurality of partial sums together.

In another exemplary aspect of the present disclosure, there is provided an analog-to-digital conversion circuit, comprising a plurality of sigma-delta modulators; and a plurality of ADC filters respectively corresponding to the plurality of sigma-delta modulators, wherein the plurality of ADC filters are respectively configured to store a plurality of partial sums as respective entries in a plurality of lookup tables, retrieve at least one of the plurality of partial sums based on an output of the sigma-delta modulator, and calculate a filter output by adding retrieved ones of the plurality of partial sums together.

In another exemplary aspect of the present disclosure, there is provided a method of calculating an output in an analog-to-digital converter, comprising storing, by an ADC filter, a plurality of partial sums as respective entries in a plurality of lookup tables; receiving, by the ADC filter and from a sigma-delta modulator, an output; retrieving, by the ADC filter, at least one of the plurality of partial sums based on the output; and adding, by the ADC filter, retrieved ones of the plurality of partial sums together so as to generate the output.

In this manner, various aspects of the present disclosure provide for improvements in at least the technical fields of imaging and image processing.

This disclosure can be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which:

FIGS. 9A and 9B illustrate exemplary clock cycles according to various aspects of the present disclosure;

DETAILED DESCRIPTION

In the following description, numerous details are set forth, such as circuit configurations, flowcharts, data tables, system configurations, and the like, in order to provide an understanding of one or more aspects of the present invention. It will be readily apparent to one skilled in the art that these specific details are merely exemplary and not intended to limit the scope of this application.

Moreover, while the present disclosure focuses mainly on examples in which the various circuits are used in image sensors, it will be understood that this is merely one example of an implementation. It will further be understood that the disclosed circuits can be used in any device in which there is a need to convert an analog signal to a digital signal; for example, an audio signal processing circuit, an industrial measurement and control circuit, a memory array, and so on.

The systems, circuits, and methods disclosed herein may, for example, provide for a peak power reduction of approximately 50% and an area reduction of about 16% for a lookup table with a width of 6 bits. Depending on the particular semiconductor processing technology used in manufacturing, on the frequency of operation, on the width of the lookup table, etc., the benefits may be modified from this example.

[Image Sensor]

Figure 1:
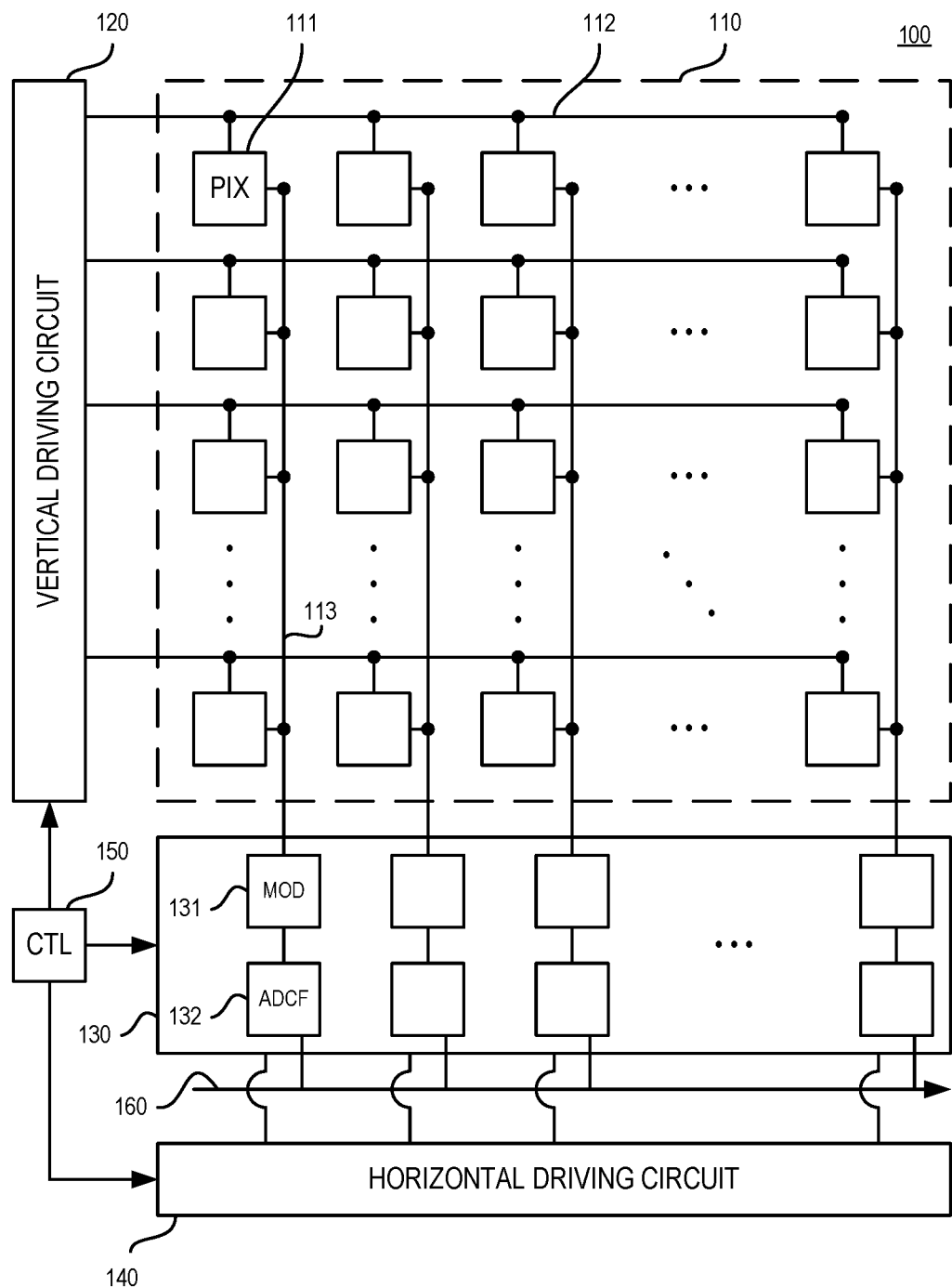
FIG. 1 illustrates an exemplary image sensor according to various aspects of the present disclosure.

FIG. 1 illustrates an image sensor 100. The image sensor 10 includes a rectangular array 110 of M×N pixel circuits 111, where M and N are positive integers. The pixel circuits 111 are located at intersections where horizontal signal lines 112 and VSLs 113 cross one another. The horizontal signal lines 112 are operatively connected to a vertical driving circuit 120, also known as a "row scanning circuit," at a point outside of the pixel array 110, and carry signals from the vertical driving circuit 120 to a particular row of the pixel circuits 111. Pixels in a particular column output an analog signal corresponding to an amount of incident light to the VSL 113. For illustration purposes, only a subset of the pixel circuits 110 are actually shown in FIG. 1; however, in practice the image sensor 100 may have up to tens of millions of pixel circuits ("megapixels" or MP) or more.

The VSL 113 conducts the analog signal for a particular column to a column circuit 130, also known as a "signal processing circuit." A row selection switch may connect the VSL 113 to the column circuit 130. While FIG. 1 illustrates one VSL 113 for each column in the pixel array 110, the present disclosure is not so limited. For example, more than one VSL 113 may be provided for each column, or each VSL 113 may correspond to more than one column. Moreover, while FIG. 1 illustrates a single column circuit 130 for all columns, the image sensor 10 may utilize a plurality of column circuits 130. The analog electrical signal generated in the pixel circuit 111 is retrieved by the column circuit 130 and is then converted to a digital value. Such a conversion typically requires several circuit components such as S/H circuits, ADCs, and timing and control circuits, with each circuit component serving a purpose in the conversion. For example, the purpose of the S/H circuit may be to sample the analog signals from different time phases of the photodiode operation, after which the analog signals may be converted to digital form by the ADC.

The ADC is preferably a sigma-delta ADC. As illustrated in FIG. 1, the sigma-delta ADC includes a sigma-delta modulator 131 and a decoder filter 132, also called an ADC filter or ADCF. Furthermore, while FIG. 1 illustrates a single ADC for a column of the pixel circuit 111, other ADC architectures are possible within the context of the present disclosure. These architectures include multiple ADCs for each column, a single ADC for multiple columns, an ADC for a sub-region (e.g. K×L pixel circuits 111 where K and L are positive integers smaller than M and N, respectively), and the like.

The column circuit 130 may be capable of performing the method of correlated double sampling (CDS). CDS is capable of overcoming some pixel noise related issues by sampling each pixel circuit 111 twice. First, the reset voltage $V_{reset}$ of a pixel circuit 111 is sampled. This may also be referred to as the P-phase value or cds value. Subsequently, the data voltage $V_{data}$ of the pixel circuit 111 (that is, the voltage after the pixel circuit 111 has been exposed to light) is sampled. This may also be referred to as the D-phase value or light-exposed value. The reset value $V_{reset}$ is then subtracted from the data value $V_{data}$ to provide a value which reflects the amount of light falling on the pixel circuit 111.

The column circuit 130 is controlled by a horizontal driving circuit 140, also known as a "column scanning circuit." Each of the vertical driving circuit 120, the column circuit 130, and the horizontal driving circuit 140 receive one or more clock signals from a controller 150. The controller 150 controls the timing and operation of various image sensor components such that analog signals from the pixel array 110, having been converted to digital signals in the column circuit 130, are output via an output circuit 160 for signal processing, storage, transmission, and the like.

Figure 2:
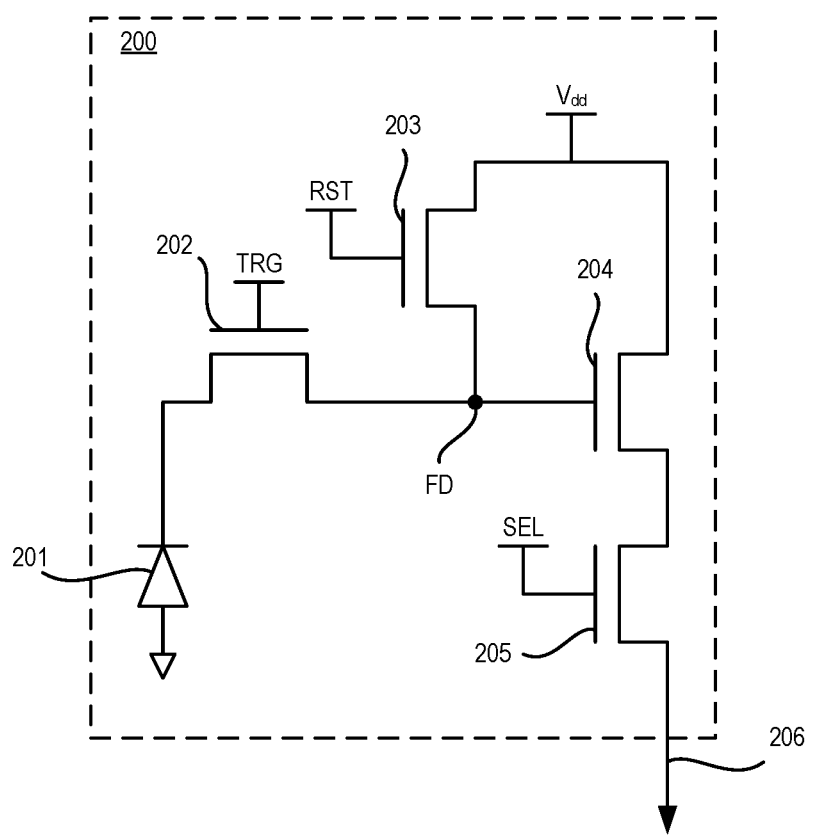
FIG. 2 illustrates an exemplary pixel circuit according to various aspects of the present disclosure.

FIG. 2 illustrates an exemplary pixel circuit 200 according to various aspects of the present disclosure. The pixel circuit 200 may be implemented in an image sensor such as the image sensor 100 described above; that is, the pixel circuit 200 may be the pixel circuit 110. As shown in FIG. 2, the pixel circuit 200 includes a photoelectric conversion device 201 (for example, a photodiode), a floating diffusion FD, a transfer transistor 202, a reset transistor 203, an amplification transistor 204, a selection transistor 205, and a VSL 206. The VSL 206 may be common to a plurality of pixel circuits within the same column. Alternatively, the VSL 206 may be shared among multiple columns. Gate electrodes of the transfer transistor 202, the reset transistor 203, and the selection transistor 205 receive signals TRG, RST, and SEL, respectively. These signals may, for example, be provided by the control or timing circuitry. Light falling on the photoelectric conversion device 201 is converted into an analog electrical signal that is output via the VSL 206.

While FIG. 2 illustrates a pixel circuit 200 having four transistors in a particular configuration, the present disclosure is not so limited and may apply to a pixel circuit having fewer or more transistors as well as other elements, such as capacitors, resistors, and the like. Moreover, while FIG. 1 illustrates the amplification transistor 215 disposed between the selection transistor 216 and a power supply voltage $V_{dd}$, the selection transistor 216 may instead be disposed between the amplification transistor 216 and the power supply voltage $V_{dd}$. Additionally, the present disclosure may be extended to configurations where one or more transistors are shared among multiple photoelectric conversion devices.

Figure 3:
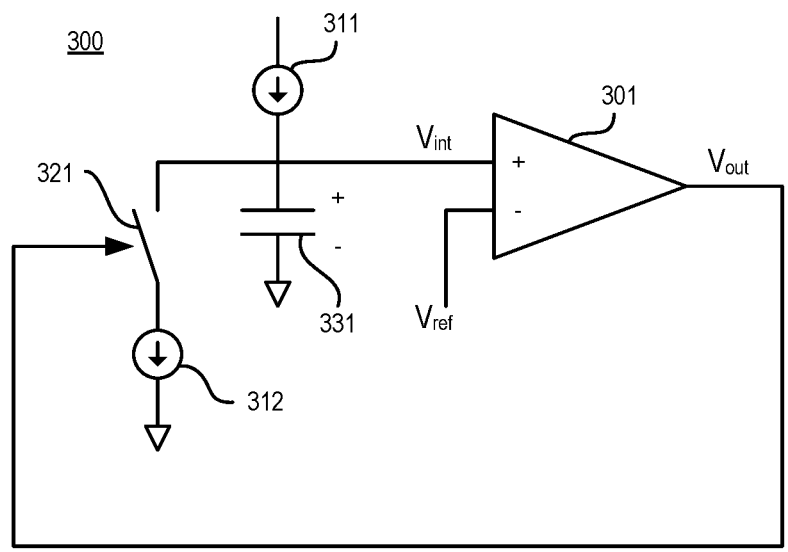
FIG. 3 illustrates an exemplary first-order current-mode sigma-delta modulator according to various aspects of the present disclosure.

FIG. 3 illustrates a first order current-mode sigma-delta modulator 300, which may be an example of the sigma-delta modulator 131 illustrated in FIG. 1. The modulator 300 receives the input analog signal from a pixel circuit, such as the pixel circuit 200, as an input current $I_{in}$, (represented as a current source 311) and uses a feedback circuit to convert the analog signal into a binary sequence $V_{out}$ under the control of a clock.

The modulator 300 further includes a clocked comparator quantizer 301, a reference current source 312 that outputs a current $I_{ref}$, a switch 321, and an integrating capacitor 331. The comparator 301 is configured to compare a voltage $V_{int}$ on the capacitor 331 with a reference voltage $V_{ref}$, and to output voltage $V_{out}$ as a comparison result. The switch 321 is configured such that when an output of the comparator 301 is at a high level, the switch 321 is closed. Conversely, when the output of the comparator 301 is at a low level, the switch 321 is opened. To achieve this, the switch 321 may preferably be a transistor, such as a MOS transistor.

While FIG. 3 illustrates a first order current mode sigma-delta modulator, high order sigma-delta modulators (e.g. second or third order) may be used. Additionally, a voltage mode sigma-delta modulator, which receives an analog voltage as an input instead of an analog current, may be used without departing from the present disclosure. In any event, the output of the sigma-delta modulator 300 is output to an ADCF, such as the decoder filter 132, which digitally filters the binary sequence $V_{out}$ and down-samples the output to the desired multi-bit digital signal. Specifically, the ADCF calculates a weighted average of the binary signal using weights given by the impulse response of a filter.

Figure 4:
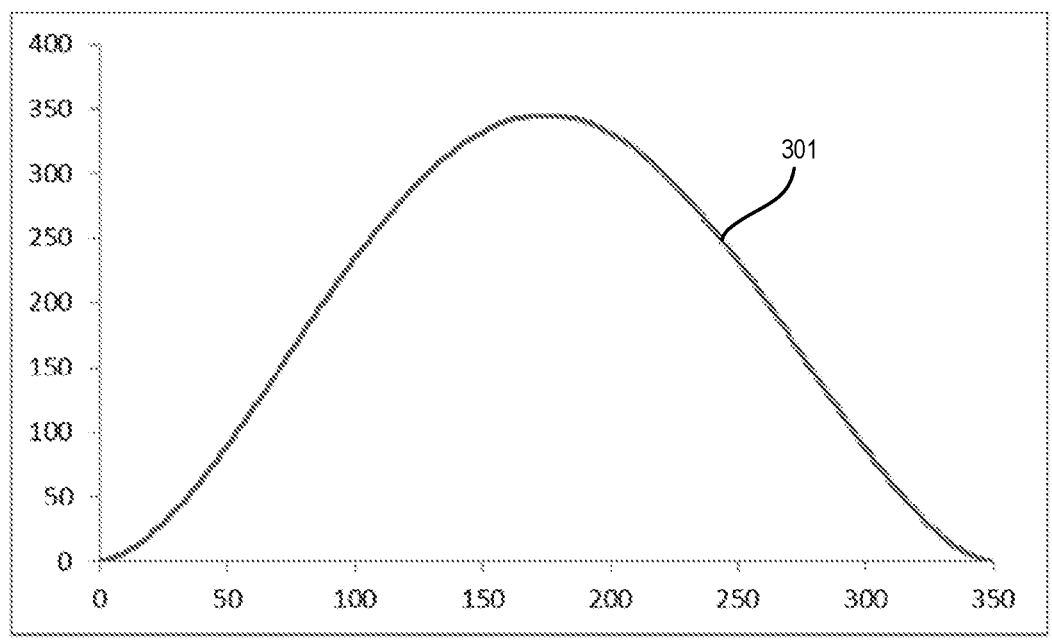
FIG. 4 illustrates an exemplary impulse response of an ADC filter according to various aspects of the present disclosure.

FIG. 4 illustrates an example of an impulse response of an ADCF where the length of the impulse response is 350. As illustrated, every impulse response term has a positive value; however, an impulse response with both positive and negative terms may also be used. For a given impulse response, the output of the ADCF can be calculated according to the following expression (1):

$$y_n = y_{mL} = \sum_{k=0}^{L-1} h_k b_{k+mL} \quad (1)$$

Above, L represents the length of the ADCF impulse response plus lookup table size minus 1, $h_k$ represents the impulse response, $b_n$ represents the input to the ADCF (i.e., the output binary sequence of the sigma-delta modulator), and $y_n$ is the output of the ADCF (i.e., the multi-bit output samples). For simplicity of illustration, expression (1) is written as a convolution sum by suitably replacing the impulse response of the filter by its mirror image. As illustrated in FIG. 4, L=350.

Typically, this calculation is performed once for a segment of L binary samples from the sigma-delta modulator. After the output is computed, $y_n$ (where n=m×L) represents a down-sample sequence which comprises multi-bit sample values. Because $b_n$ is either 0 or 1 for any n, the calculation of $y_n$ is equivalent to summing the impulse response values $h_k$ which correspond to the 1s in the binary sequence $b_n$. To generate an output value using an ADCF of length L in a direct implementation of expression (1), the number of necessary summations is between 0 and L−1 depending on the number of is in the bit stream. The ADCF consumes maximum power when the binary sequence $b_n$ is all 1s. In this case, the peak power consumption level for the ADCF is denoted as $P_{max}$. To significantly reduce the number of additions required to compute each output, and thereby to reduce the peak power consumption level, the sum in expression (1) may be broken up into a plurality of terms where each term represents a partial sum that can be retrieved by lookup tables.

First Example of an Output Computation Procedure

In one example, the sum in expression (1) may be broken up into a plurality of terms having equal size. In other words, an integer M may be chosen such that the sum in expression (1) is partitioned into M groups where each group includes N coefficients. In this case, the relationship M×N=L holds. The filtering procedure of expression (1) may thus be rewritten according to the following expression (2):

$$y_n = y_{mL} = \sum_{i=0}^{M-1} s_i \quad (2)$$

Above, $s_i$ is a partial sum represented by the following expression (3):

$$s_i = \sum_{j=0}^{n-1} h_{iN+j} b_{iN+j+mL} \quad (3)$$

As noted above, each of the bit values $b_n$ is binary; that is, either 0 or 1. Because there are N terms in expression (3), there are $2^N$ possible output values for $s_i$, each of which correspond to one of the possible $2^N$ bit patterns for the set $\{b_{iN+mL}, b_{iN+mL+1}, \ldots, b_{(i+1)N+mL-1}\}$. Therefore, the set of all possible partial sum values $s_i$ may be pre-calculated and stored in a table. In an implementation corresponding to an ADCF, the desired value $s_i$ may be retrieved from the table using the bit pattern as an address. Because the all-zero bit pattern always results in a zero value for $s_i$, this entry may be excluded and it is only necessary to store $2^N-1$ entries.

With a set of lookup tables LUTi for all i from 0 to M−1, it is possible to partition a given binary input stream into blocks of bits which are then used as addresses to retrieve the value of the partial sum $s_i$ for each i. The retrieved partial sums may themselves be summed to produce the ADCF output. This requires M−1 additions to calculate an output value from the ADCF, which is substantially lower than the L−1 additions in the absence of partitioning, by a factor of approximately N. Therefore, the power consumption is approximately $(1/N) \times P_{max}$.

This lookup table can be implemented by a combination of multiplexer (MUXs) and adders. For example, a lookup table of 8:1 can be either 256 entries with 8-bit addresses, two 4:1 MUXs each having sixteen entries plus an additional adder, or four 2:1 MUXs each having four entries plus three additional adders. Each of the above are different implementations of an equivalent 8:1 lookup table with tradeoffs between the number of MUXs and the number of adders.

Figure 5:
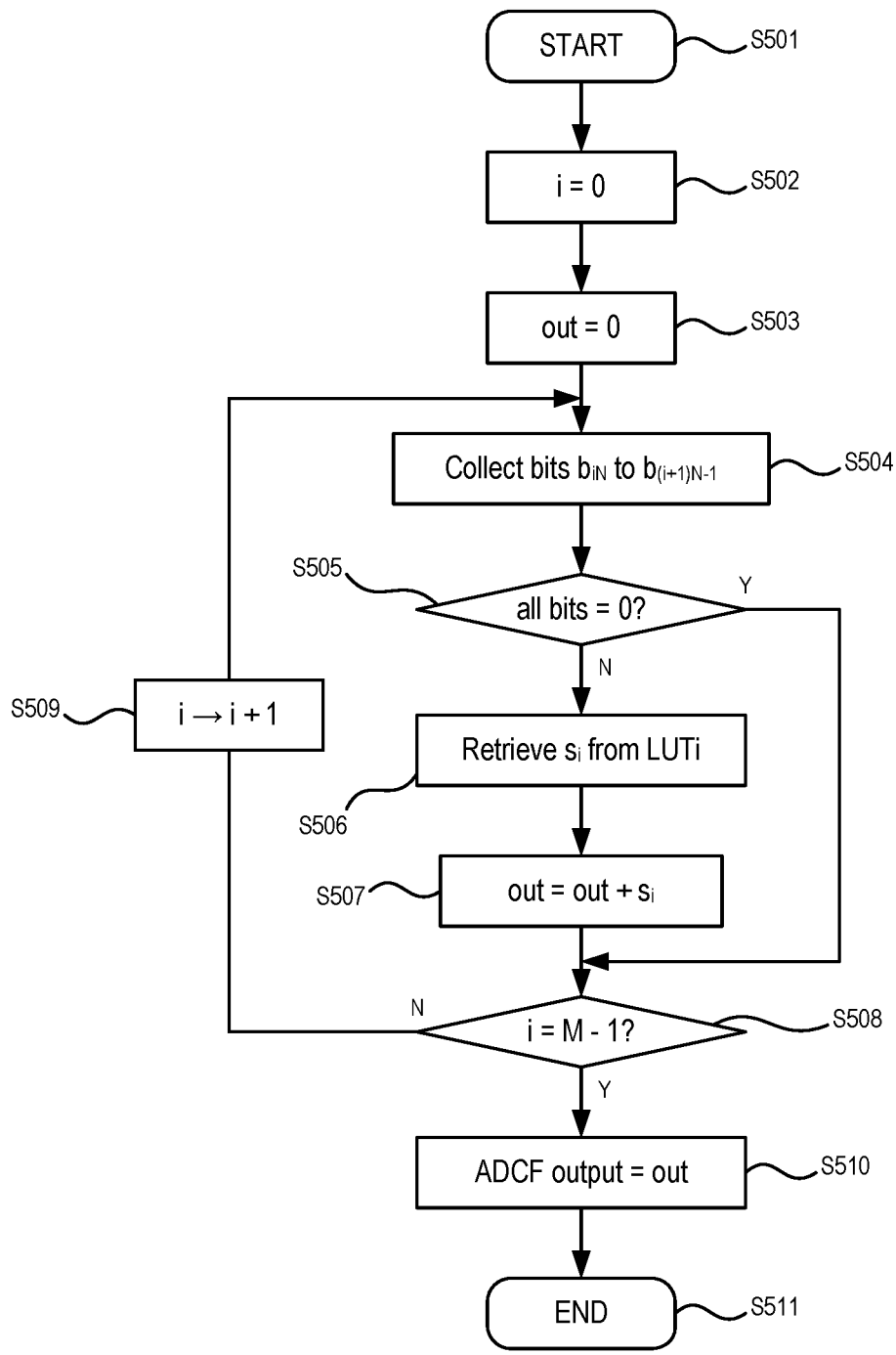
FIG. 5 illustrates an exemplary process flow for calculating the output in an ADC filter according to various aspects of the present disclosure.

FIG. 5 illustrates an exemplary process flow for calculating the ADCF output using the above operations. The calculation is initialized at S501. At S502, an index value i is set to zero. At S503, a variable out which stores a temporary output value for the ACDF is set to zero. At S504, N bits $b_{iN}$, $b_{iN+1}$, $b_{(i+1)N-1}$ are collected from the sigma-delta modulator. At S505, the collected bits are checked to determine if all N bits are zero. If any one of the N bits is nonzero, the sequence of N bits is used as an address to retrieve a partial sum $s_i$ from a lookup table LUTi at S506. At S507, the retrieved partial sum $s_i$ is added to the variable out. If all of the N bits are zero, the processing skips S506 and S507. In either case, at S508 the index i is checked to determine if it is equal to M−1. If i is not equal to M−1, the index i is incremented by one at S509 and subsequently S504-S508 are repeated. If i is equal to M−1, then at S510 the ADCF output value is set equal to the variable out. At S511 the process flow terminates.

Second Example of an Output Computation Procedure

While the above example requires that each partition be of the same size, this can be generalized to the use of tables of different sizes. For example, the sum in expression (1) may be broken up into a plurality of terms respectively having size $N_0, N_1, \ldots, N_{M+1}$ where $N_0+N_1+ \ldots +N_{M-1}=L$. The filtering procedure of expression (1) may thus be rewritten according to the following expression (4):

$$y_n = y_{mL} = \sum_{i=0}^{M-1} \left( \sum_{j=0}^{N_i-1} h_{R_i+j} b_{R_i+j+mL} \right) \quad (4)$$

Above, $R_i$ is represented by the following expression (5):

$$R_i = \begin{cases} 0, & i = 0 \\ R_{i-1} + N_{i-1}, & i = 1, 2, \ldots, M-1 \end{cases} \quad (5)$$

In this example, there are M lookup tables and each table i includes $N_i$ entries. M and $N_i$ may be arbitrarily chosen subject to the condition noted above that $N_0+N_1+ \ldots +N_{M-1}=L$. In one illustrative example, consider an ADCF with 16 filter coefficients; i.e, L=15. M and $N_i$ may be chosen such that M=5, $N_0=N_1=4$, $N_2=3$, and $N_3=N_4=2$. This ADCF using the given set of values can be implemented using five lookup tables. The number of entries stored in each lookup table and the values of the entries for this example are summarized in the following Table 1:

TABLE 1

Example of lookup table contents

| table | $N_i$ | # of entries | address | $s_i$ |
|---|---|---|---|---|
| LUT0 | 4 | 15 | $(b_0, b_1, b_2, b_3)$ | $b_0 h_0 + b_1 h_1 + b_2 h_2 + b_3 h_3$ |
| LUT1 | 4 | 15 | $(b_4, b_5, b_6, b_7)$ | $b_4 h_4 + b_5 h_5 + b_6 h_6 + b_7 h_7$ |
| LUT2 | 3 | 7 | $(b_8, b_9, b_{10})$ | $b_8 h_8 + b_9 h_9 + b_{10} h_{10}$ |
| LUT3 | 2 | 3 | $(b_{11}, b_{12})$ | $b_{11} h_{11} + b_{12} h_{12}$ |
| LUT4 | 2 | 3 | $(b_{13}, b_{14})$ | $b_{13} h_{13} + b_{14} h_{14}$ |

In Table 1, $b_i$ represents a bit value which can be either 0 or 1. For each table, the $b_i$ values in the "address" column are used as an address to look up the value of the partial sum, which is given by the "$s_i$" column. As noted above, the partial sum $s_i$ for the all-zero case is always equal to zero and thus does not need to be stored.

Figure 6:
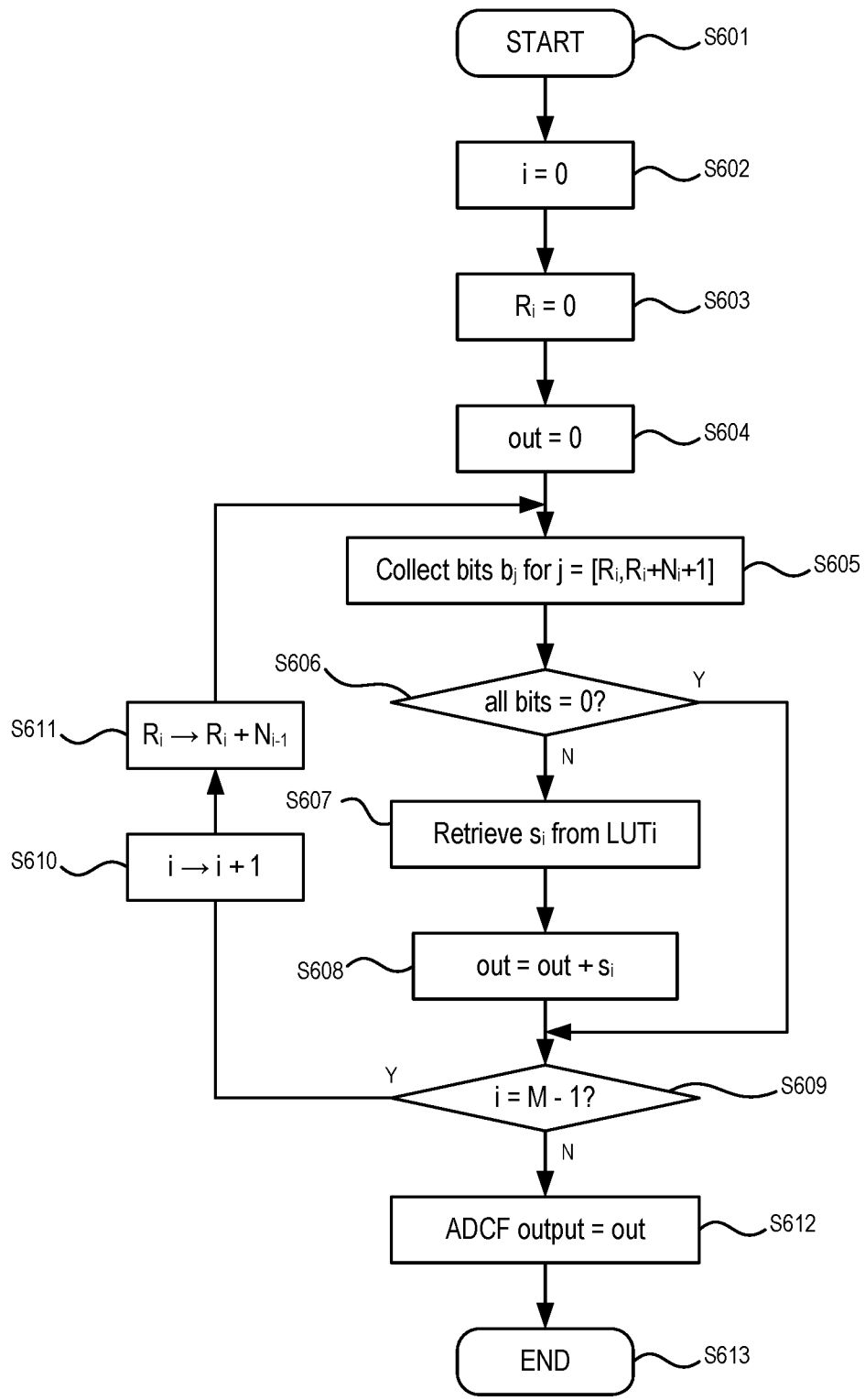
FIG. 6 illustrates another exemplary process flow for calculating the output in an ADC filter according to various aspects of the present disclosure.

FIG. 6 illustrates an exemplary process flow for calculating the ADCF using the above operations. The calculation is initialized at S601. At S602, an index value i is set to zero. At S603, a range index $R_i$ is set to zero. At S604, a variable out which stores a temporary output value for the ACDF is set to zero. At S605, $N_i$ bits $b_j$ where j ranges from $R_i$ to $R_i+N_i-1$ are collected from the sigma-delta modulator. At S606, the collected bits are checked to determine if all $N_i$ bits are zero. If any one of the $N_i$ bits is nonzero, the sequence of $N_i$ bits is used as an address to retrieve a partial sum $s_i$ from a lookup table LUTi at S607. At S608, the retrieved partial sum $s_i$ is added to the variable out. If all of the $N_i$ bits are zero, the processing skips S607 and S608. In either case, at S609 the index i is checked to determine if it is equal to M−1. If i is not equal to M−1, the index i is incremented by one at S610, the index $R_i$ is updated by adding $N_{i-1}$ at S611, and subsequently S605-S609 are repeated. If i is equal to M−1, then at S612 the ADCF output value is set equal to the variable out. At S613 the process flow terminates.

Thus, this example of the output computation procedure provides an additional level of flexibility in the design. For example, structural or circuit constraints on the system might dictate that the data from the ADC comes in 8 bits at a time. In this case, it is possible to use a lookup table of width 8; that is, having 255 addresses which excludes the all-zero bit pattern. However, the lookup table internal implementation may be done by a single lookup table or a combination of smaller lookup tables plus additional adders as noted above. If, for example, a lookup table of width 8 is not desired (e.g., if it is not efficient enough due to the number of MUXs required), it is possible to use alternative implementations. The lookup table may be implemented using a 3-3-2 arrangement with two lookup tables of width 3 and one lookup table of width 2; a 2-2-2-2 arrangement with four lookup tables of width 2, and so on. In the 3-3-2 arrangement, for example, three pre-sums (Pre0, Pre1, and Pre2) are calculated using lookup tables from the 8 bits. Then, a multi-operand adder may be used to sum the three pre-sums at once to produce an accumulated sum $Accum_{new}=Accum_{old}+Pre0+Pre1+Pre2$. Multi-operand adders are preferred due to their efficiency in terms of power and area.

Third Example of an Output Computation Procedure

In addition to average power consumption, in certain implementations it may be desirable to limit the instantaneous peak power consumption. For example, in an image sensor having a column architecture, one ADC is provided per column of pixel circuits. Thus, each of the multiple ADCs generate a respective binary bit stream which is then processed by a corresponding ADCF for each column. If the implementation and processing are done in a straightforward manner in which every ADC starts and converts at the same time, all of the ADCFs will perform additions from the lookup table output at the same time. This may result in a power profile include large power spikes. That is, the power for the ADCFs remain at a low level when none of the ADCFs are performing addition, but a large power spike occurs when every ADCF is adding a new partial sum simultaneously. To smooth out the power consumption profile and provide a significant reduction in peak power consumption, it is preferable to introduce targeted delays to the start times of the ADCs.

To illustrate this phenomenon, consider an implementation where the ADCF length is 240, and where the impulse response for each ADCF is partitioned into 30 groups of eight coefficients each. In other words, L=240, M=30, and N=8. Instead of starting all ADCFs at the same time, the start times of the ADCFs are partitioned into eight groups. Thus, ADCF0, ADCF8, ADCF16, etc., start at clock 0; ADCF1, ADCF9, ADCF17, etc., start at clock 1; and so on. That is, ADCFk, the ADCF at column k, starts at clock (k mod 8), and each group of 8 columns (i.e., ADCF0 to ADCF7) may be treated as one unit. In this example, N=8 and thus 8 bits are required to look up a partial sum in a lookup table. For each ADCF, a latch circuit of width 9 is used to store the 8 bits. The reason that a width of 9 and not 8 is used will be discussed in more detail below.

Figure 7:
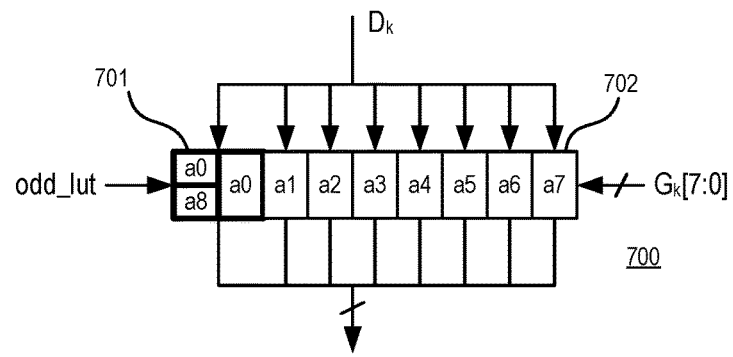
FIG. 7 illustrates an exemplary latch circuit array according to various aspects of the present disclosure.
Figure 8A:
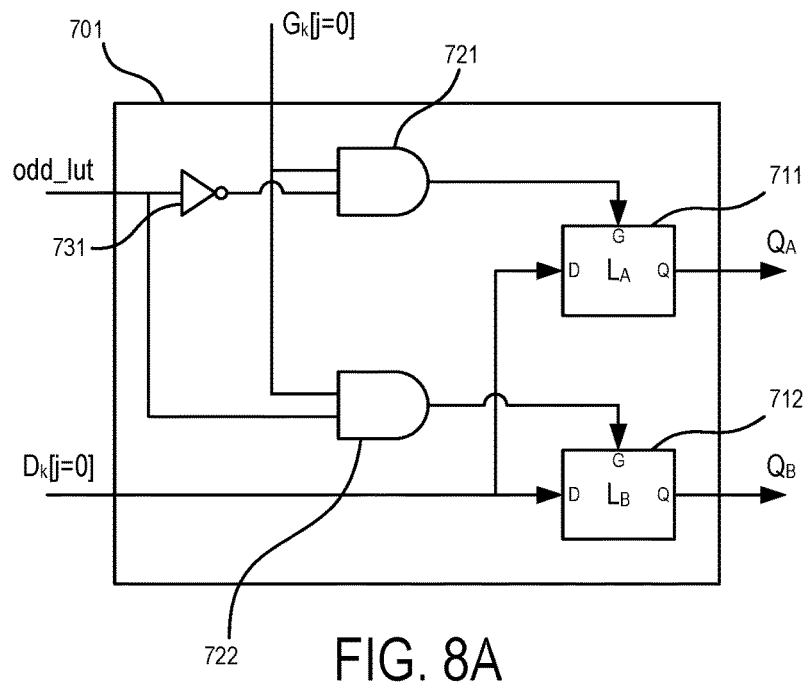
FIGS. 8A and 8B illustrate exemplary latch circuits for the exemplary latch circuit array according to FIG. 7.
Figure 8B:
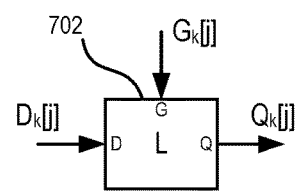

FIG. 7 illustrates an exemplary latch circuit 700 of width 9. The latch circuit 700 includes a double latch circuit 701 for bit portion a0, outlined in bold, and a plurality of simple latch circuits 702 for bit portions a1 to a7. The double latch circuit 701 may output either a0 or a8 depending on the control signal odd_lut. As illustrated in FIG. 8A, the double latch circuit 701 includes a pair of simple latch circuits 711 and 712, a pair of AND gates 721 and 722, and an inverter 731. The double latch circuit 701 receives a data signal $D_k[j]$, the control signal odd_lut, and a gate signal $G_k[j]$, where j=0 because the double latch circuit 701 is at the 0th column. The double latch circuit 701 is arranged such that the gate of the simple latch circuit 711 receives an inverted version of the control signal odd_lut via the inverter 731 and the AND gate 721, whereas the gate of the simple latch circuit 712 receives the control signal odd_lut via the AND gate 722. The double latch circuit 701 outputs a first output signal $Q_A$ from the first simple latch circuit 711 and a second output signal $Q_B$ from the second simple latch circuit 712. The simple latch circuit 702 receives a data signal $D_k[j]$ and a gate signal $G_k[j]$, where j is an integer between 1 and 7 inclusive which indicates the column location of the simple latch circuit 702. The simple latch circuit 702 outputs an output signal $Q_k[j]$. While FIGS. 7 and 8A-B illustrate an exemplary latch circuit 700, the present disclosure is not so limited. A circuit with equivalent properties may also be implemented using flip flops, FPGA(s), a microcontroller, or other circuits.

Figure 9A:
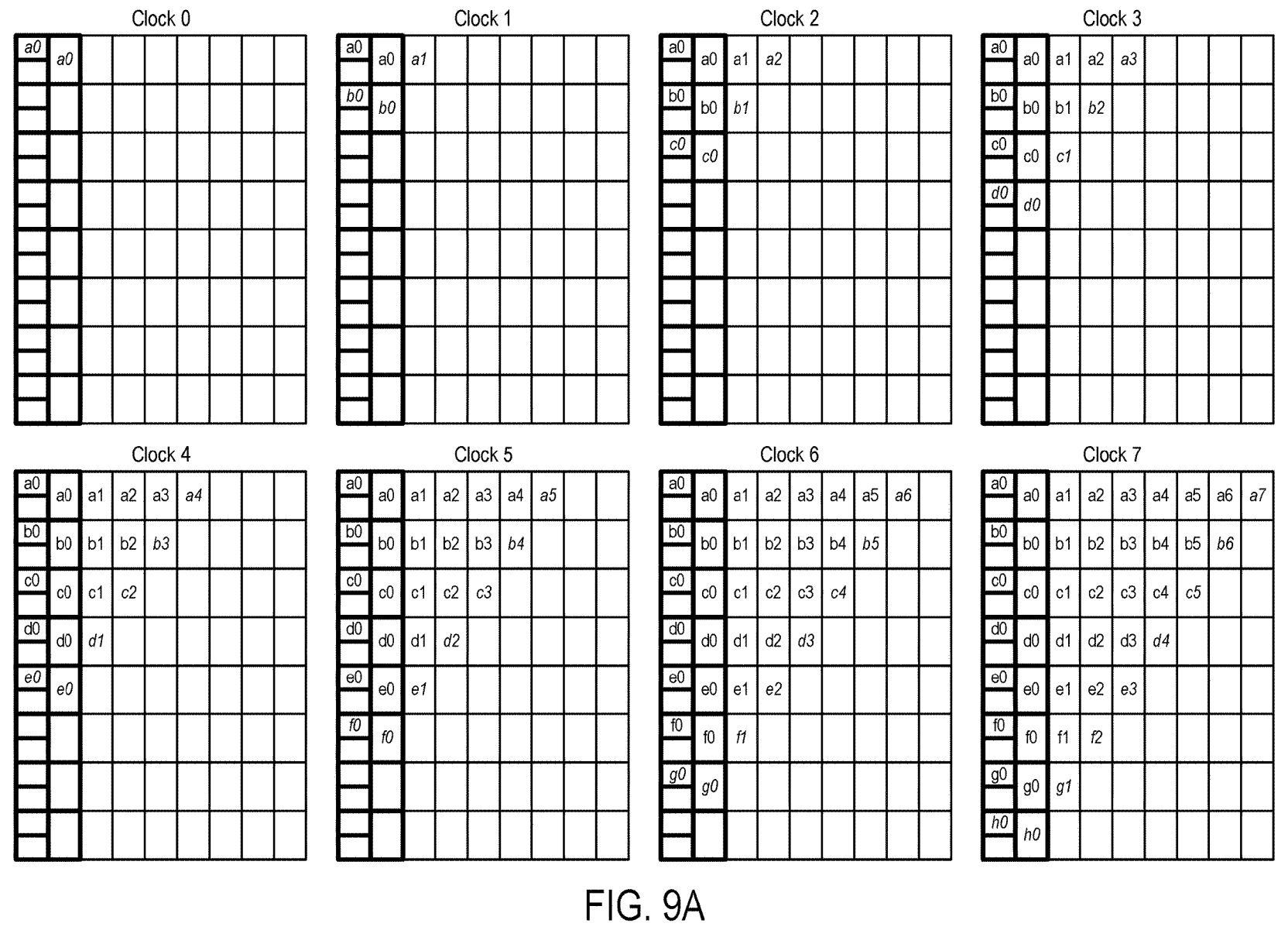
Figure 9B:
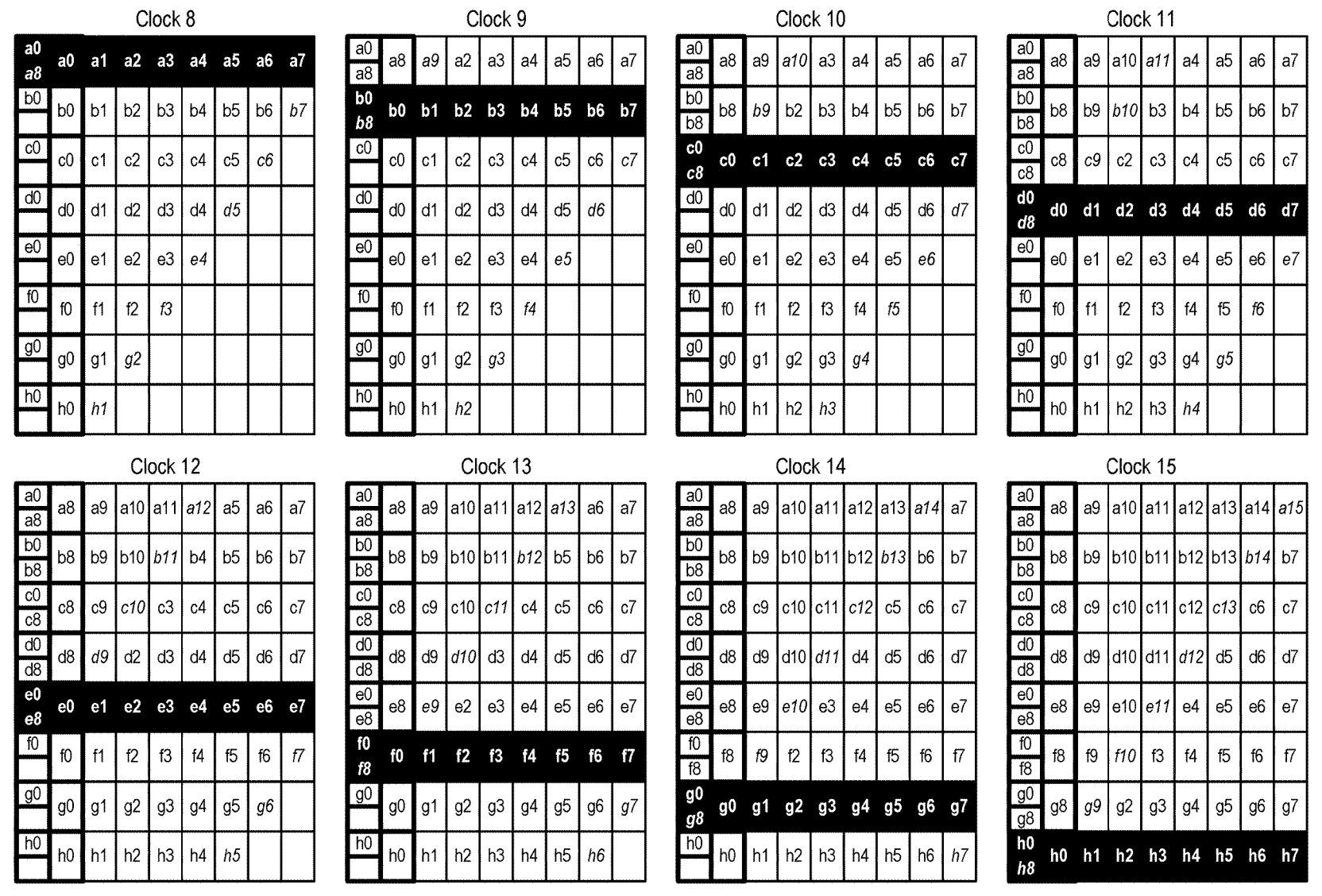

FIGS. 9A-9B illustrate a set of 16 clock cycles, from Clock 0 to Clock 15, according to this sequential-timing example. Each row represents a particular ADCF which is implemented using a latch circuit such as the latch circuit 700 illustrated in FIG. 7. Thus, each row includes a double latch circuit which holds two bits of data, where one bit is a new bit from the sigma-delta modulator and another bit is the existing data used to retrieve a partial sum from a lookup table, and seven simple latch circuits which hold one bit of data each. Each block has eight rows, and thus illustrates eight ADCFs. For purposes of explanation, the ADCFs will be referred to as ADCFk where k indicates the row.

As illustrated in FIGS. 9A-B, a newly-latched bit is denoted with italics. At Clock 0, ADCF0 is started and a first input bit a0 is sent to a double latch circuit which stores the value of a0. At Clock 1, an additional bit a1 is latched by a simple latch circuit in ADCF0 and, at the same time, ADCF1 is started and an additional bit b0 is sent to a double latch circuit therein. At Clock 2, an additional bit a2 is latched for ADCF0, an additional bit b1 is latched for ADCF1, and an additional bit c0 is latched for ADCF2. This process continues until clock 7 where ADCF7 is started. At the end of Clock 7, 8 bits have been latched for ADCF0, 7 bits have been latched for ADCF1, and so on, with 1 bit having been latched for ADCF7.

As illustrated in FIG. 9B, an ADCFk (i.e., a row) that is illustrated with a black background indicates bits that are used for addressing the lookup table on this Clock cycle. In other words, at Clock 8, a table look up is performed for ADCF0 using bits a0, a1, . . . , a7 as an address and a partial sum is retrieved and added to a memory location which stores the temporary output value. At the same time, a new bit a8 is latched for ADCF0 because the corresponding sigma-delta modulator continues to generate bits for the ADCF. Because it is necessary to latch a new bit a8 as well as to use the original bit a0 for addressing the lookup table, the bit position a0/a8 is implemented using a double latch circuit such as the double latch circuit 701 illustrated in FIGS. 7 and 8A. Thus, as noted above, the latch circuit 700 has a length of 9 bits in the case where N=8. In general, the number of latches for each ADCF should be N+1 for this reason.

Furthermore, during Clock 8, a new bit b7, c6, h1 is latched into each of ADCF1 to ADCF7. After retrieving the partial sum for ADCF0 (e.g. at Clock 9), the bits a0-a7 are no longer needed for ADCF0. As a result, at this time only one useful bit a8 is latched into ADCF0 at this point. At Clock 9, a similar action is performed where the original 8 bits b0-b7 are used to retrieve a partial sum for ADCF1, the partial sum is added to a memory that stores an output value for ADCF1, and new bits are latched into each of ADCF0 through ADCF7. This procedure is repeated for successive clock cycles until, at the end of Clock 15, the lookup table has been addressed and the partial sums added for each of ADCF0 through ADCF7. As a result, this example uses different starting times for each group of eight ADCFs so that one partial sum retrieval and one addition are performed at every clock cycle. This maintains the hardware operation in a steady state and eliminates the spikes in the power consumption profile. In comparison to an implementation where all ADCFs are started at the same time, this example reduces the peak power to approximately ⅛ of the comparative peak.

Figure 10:
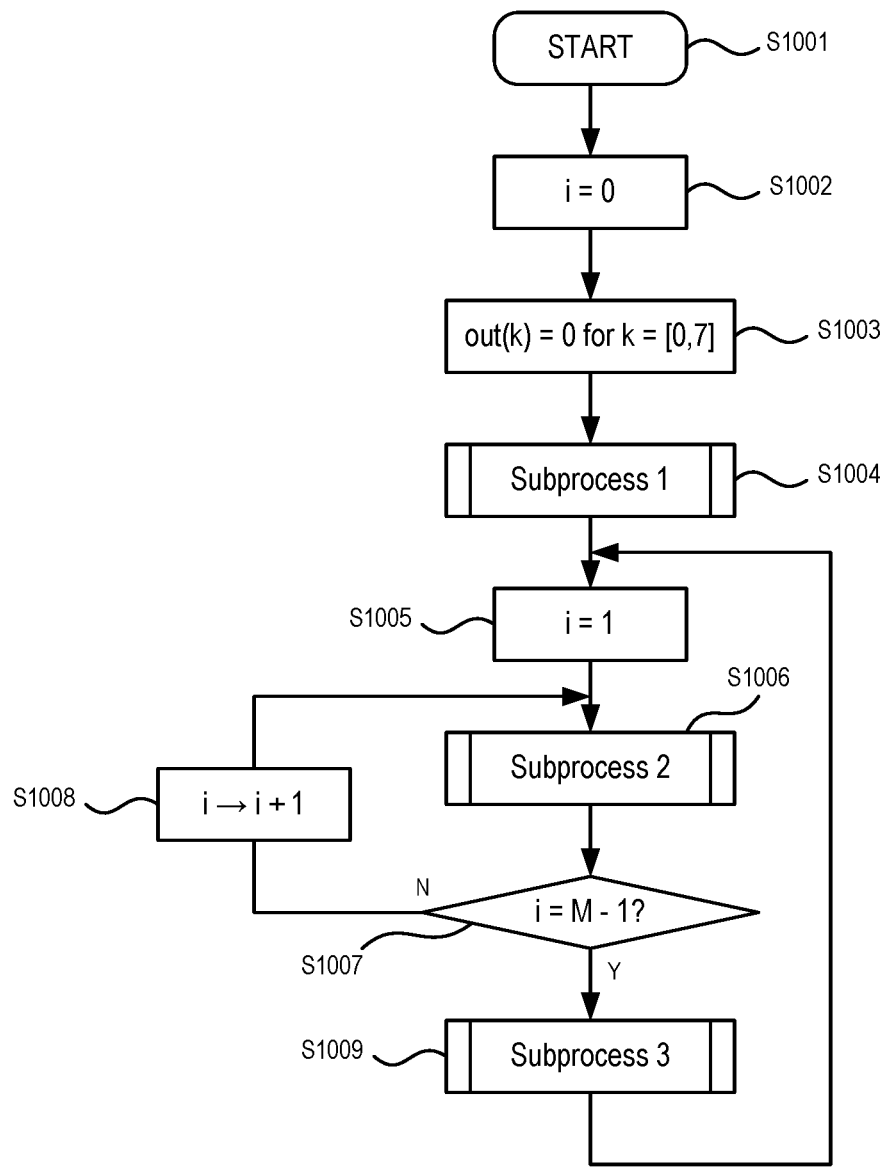
FIG. 10 illustrates another exemplary process flow for calculating the output in an ADC filter according to various aspects of the present disclosure.

FIGS. 10-15 illustrate a series of exemplary process and subprocess flows for the first eight ADCFs (i.e., ADCF0 to ADCFk). In FIG. 10, once the ADCFs are started, it is assumed that they will be operated continuously to generate a sequence of output samples for each ADCF. Alternatively, in FIG. 14, it is assumed that each ADCF will only be used to produce one output sample and will be stopped afterward. If an ADCF is to be started again after the execution of the process flow illustrated in FIG. 14, the process flow of FIG. 14 may be started again from the beginning thereof.

As illustrated in FIG. 10, the calculation is initialized at S1001. At S1002, an index value i is initialized to 0. At S1003, output variables out(k) fork in the range 0, 1, . . . , 7 are initialized to 0. Each output variable out(k) stores a temporary output value for a corresponding ADCFk. At S1004, Subprocess 1 is executed, in which the task of starting each ADCF and latching the initial bits is performed. The details of Subprocess 1 are illustrated in the exemplary subprocess flow of FIG. 11.

Figure 11:
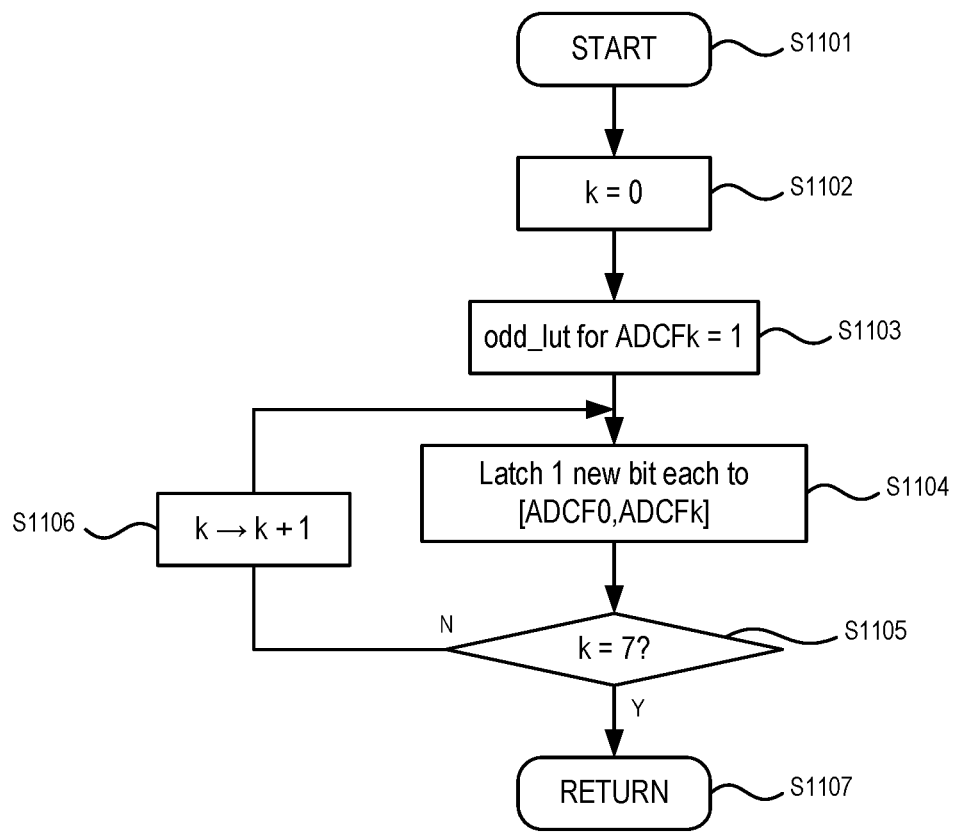
FIG. 11 illustrates an exemplary subprocess flow in the exemplary process flow according to FIG. 10.

As illustrated in FIG. 11, the subprocess begins at S1101. At S1102, an index k is initialized to 0. At S1103, the control signal odd_lut for ADCFk is set to 1. This is done so as to configure the double latch circuit (e.g., the double latch circuit 701 of FIGS. 7 and 8A) so that the first bit of the ADCFk is received in the desired position. At S1104, one new bit is latched to the first k+1 ADCFs, from ADCF0 to ADCFk. This performs a task as illustrated in each clock cycle of FIG. 9A, where the value k is equivalent to the clock number in FIG. 9A. At S1105, the index k is checked to determine if it is equal to 7. IF it is not equal to 7, the index k is incremented by 1 at S1106 and subsequently S1104 and S1105 are repeated. If k is equal to 7, then at S1107 Subprocess 1 terminates and control returns to the process flow of FIG. 10.

As illustrated in FIG. 10, after Subprocess 1 has been completed, at S1005 the index i is set to 1. Then, at S1006, Subprocess 2 is executed in which the task of reading a partial sum for each ADCF and latching new bits is performed. The details of Subprocess 2 are illustrated in the exemplary subprocess flow of FIG. 12.

Figure 12:
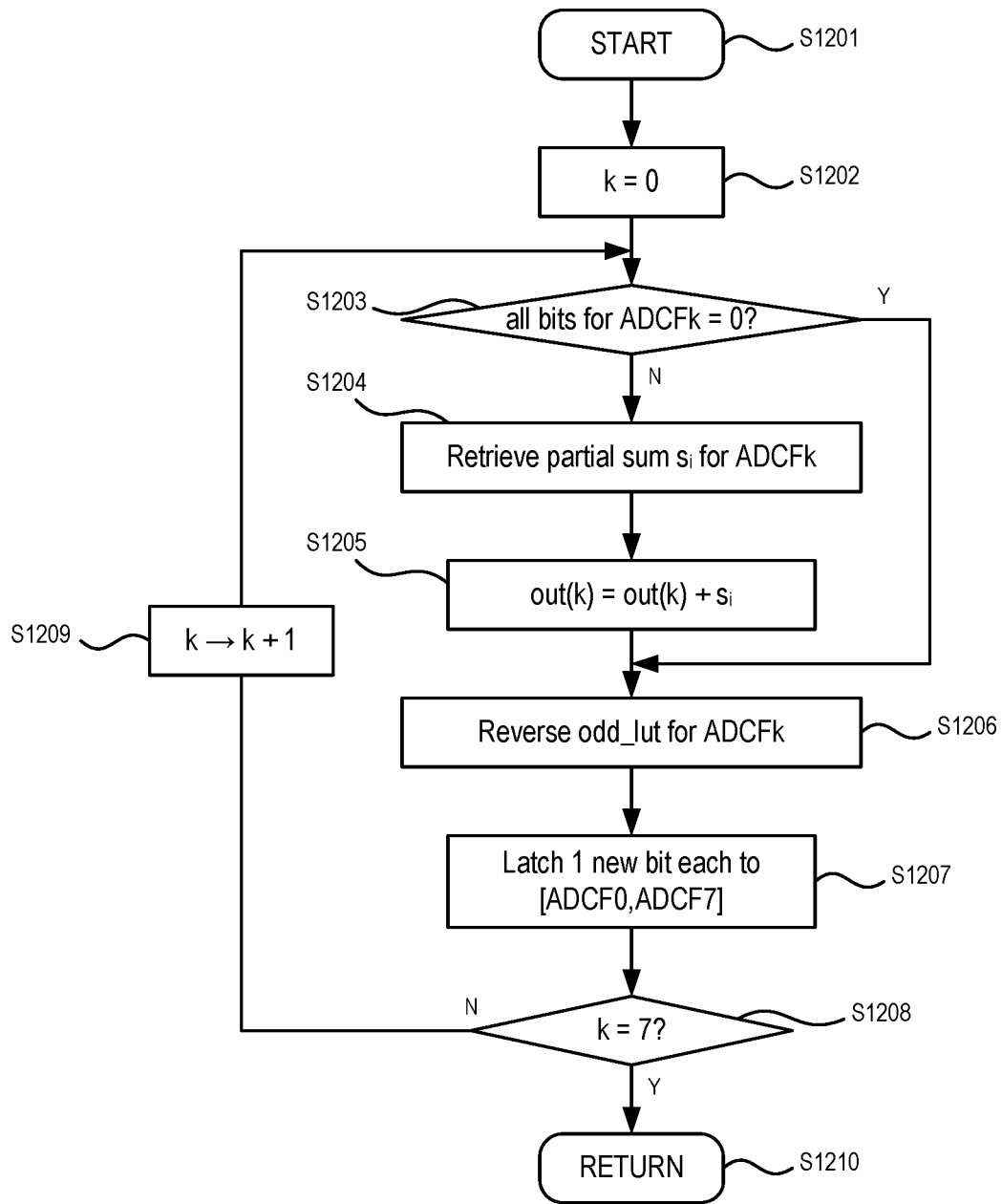
FIG. 12 illustrates another exemplary subprocess flow in the exemplary process flow according to FIG. 10.

As illustrated in FIG. 12, the subprocess begins at S1201. At S1202, an index k is initialized to 0. At S1203, the bits for ADCFk are checked to determine if all bits are zero. If any one of the bits is nonzero, a partial sum $s_i$ for ADCFk is retrieved at S1304. At S1205, the partial sum value for ADCFk is added to the temporary output variable out(k). If all of the bits are zero at S1203, the processing skips S1204 and S1205. In either case, at S1206 the control signal odd_lut for ADCFk is reversed so as to preserve the previously-latched bit for ADCFk at the double latch circuit position, and to prepare the double latch circuit to retrieve a new bit. In this manner, it is possible to keep both the "old" bit and the "new" bit. At S1207, one new bit is latched to all ADCFs, from ADCF0 to ADCF7. This performs a task as illustrated in each clock cycle of FIG. 9B, where the value k is equivalent to the clock number modulo 8 in FIG. 9B. At S1208, the index k is checked to determine if it is equal to 7. If it is not equal to 7, the index k is incremented by 1 at S1209 and subsequently S1203 to S1208 are repeated. If k is equal to 7, then at S1210 Subprocess 2 terminates and control returns to the process flow of FIG. 10.

As illustrated in FIG. 10, after Subprocess 2 has been completed, the index i is checked to determine if it is equal to M−1 at S1007. If i is not equal to M−1, the index i is incremented by one at S1008 and subsequently S1006 and S1007 are repeated. If i is equal to M−1, then at S1009 Subprocess 3 is executed in which a procedure similar to Subprocess 2 is performed but with additional steps for computing the output of each ADCF and reinitializing the temporary output variables out(k). The details of Subprocess 3 are illustrated in the exemplary subprocess flow of FIG. 13.

Figure 13:
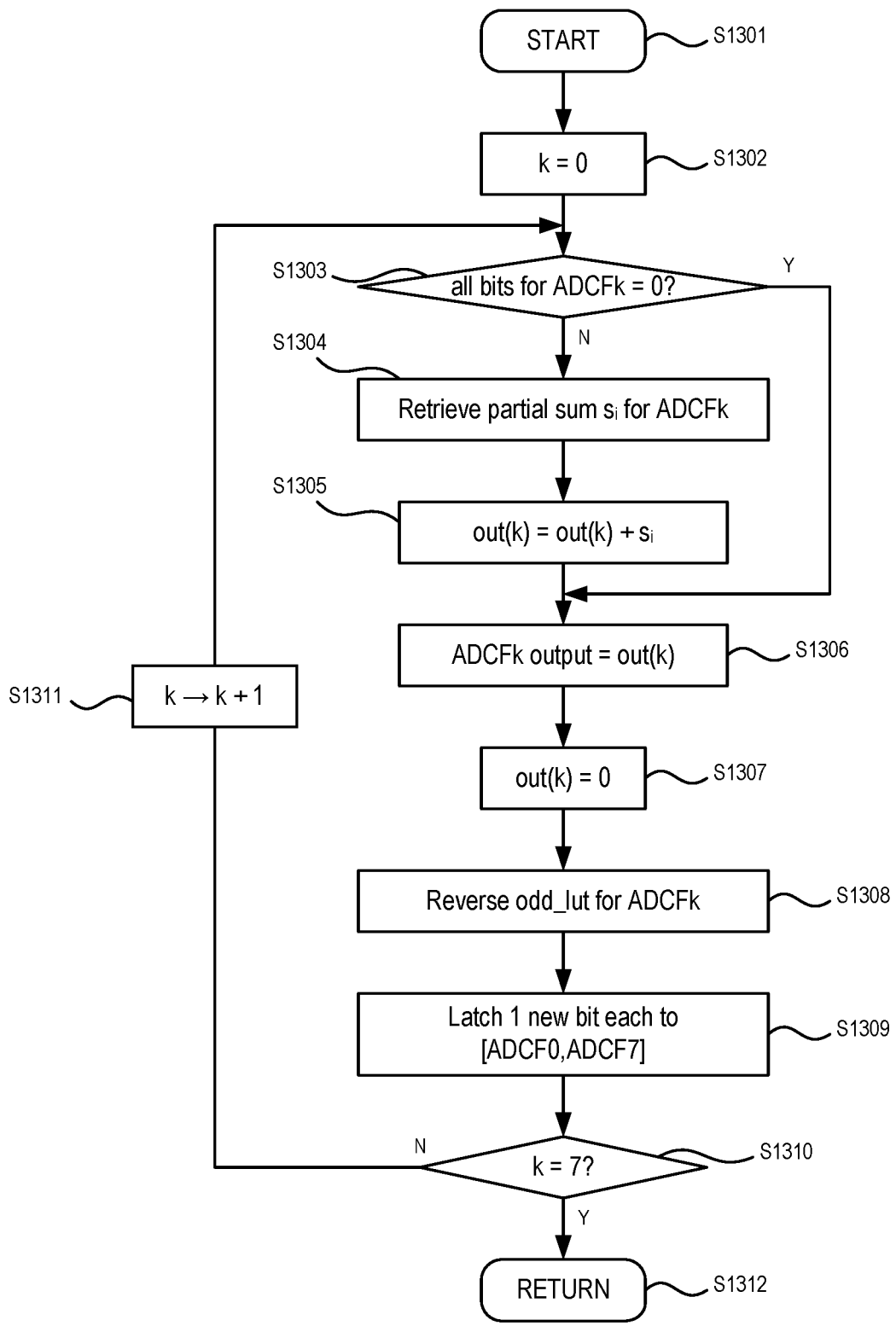
FIG. 13 illustrates another exemplary subprocess flow in the exemplary process flow according to FIG. 10.

As illustrated in FIG. 13, the subprocess begins at S1301. At S1302, an index k is initialized to 0. At S1303, the bits for ADCFk are checked to determine if all bits are zero. If any one of the bits is nonzero, a partial sum $s_i$ for ADCFk is retrieved at S1304. At S1305, the partial sum value for ADCFk is added to the temporary output variable out(k). If all of the bits are zero at S1303, the processing skips S1304 and S1305. In either case, at S1306 the output of ADCFk is set to the value of the temporary output variable out(k) and is transferred to the output, and at S1307 the temporary output variable out(k) is reset to 0. At S1308 the control signal odd_lut for ADCFk is reversed so as to preserve the previously-latched bit for ADCFk at the double latch circuit position, and to prepare the double latch circuit to retrieve a new bit. In this manner, it is possible to keep both the "old" bit and the "new" bit. At S1309, one new bit is latched to all ADCFs, from ADCF0 to ADCF7. At S1310, the index k is checked to determine if it is equal to 7. If it is not equal to 7, the index k is incremented by 1 at S1311 and subsequently S1303 to S1310 are repeated. If k is equal to 7, then at S1312 Subprocess 3 terminates and control returns to the process flow of FIG. 10. As illustrated in FIG. 10, after Subprocess flow 3 has been completed the process flow returns to S1005.

Figure 14:
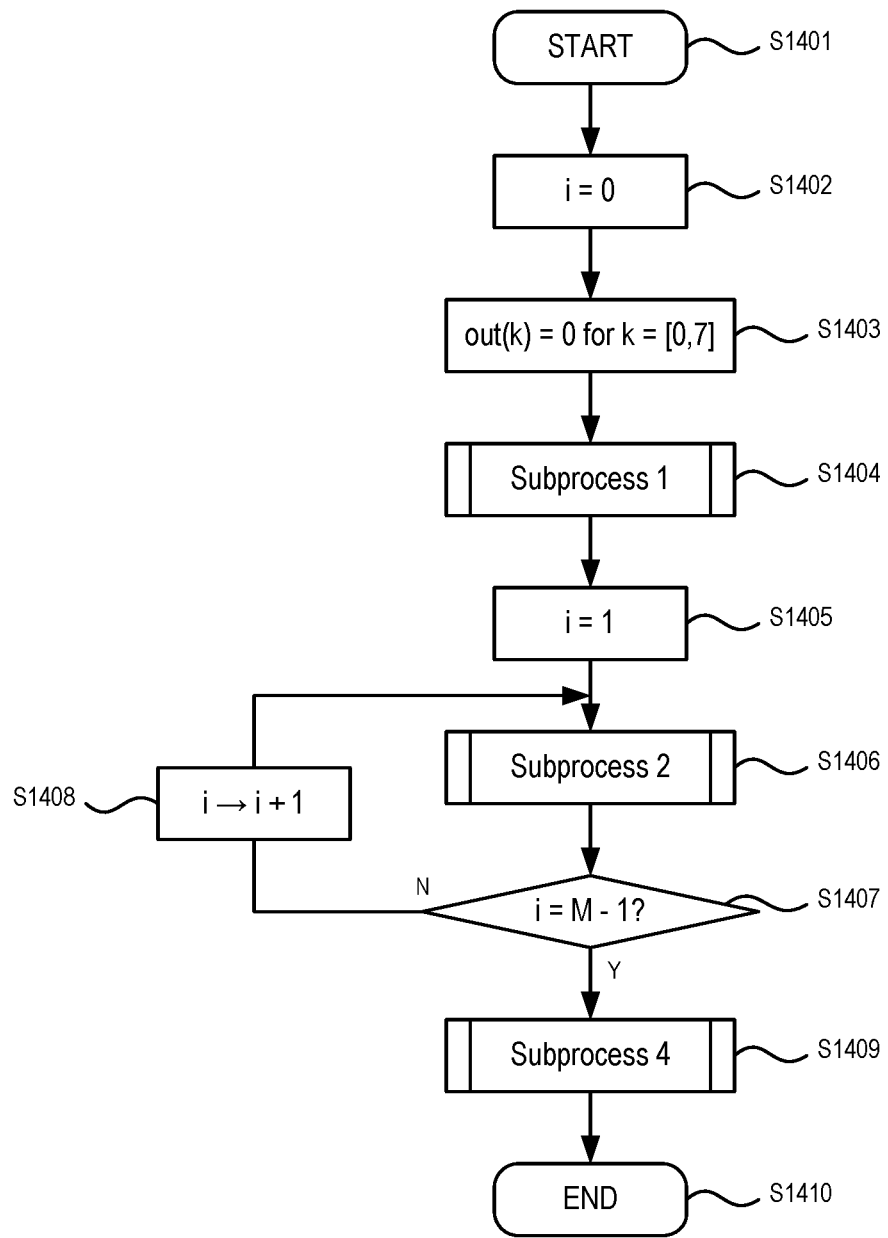
FIG. 14 illustrates another exemplary process flow according to various aspects of the present disclosure.

Instead of the continuous operation of FIGS. 10-13, it is possible that each ADCF is used to produced one output sample and will be stopped afterward. This may be implemented by the exemplary process flow of FIG. 14. As illustrated in FIG. 14, the calculation is initialized at S1401. At S1402, an index value i is initialized to 0. At S1403, output variables out(k) for k in the range 0, 1, . . . , 7 are initialized to 0. Each output variable out(k) stores a temporary output value for a corresponding ADCFk. At S1404, Subprocess 1 is executed, in which the task of starting each ADCF and latching the initial bits is performed. The details of Subprocess 1 are illustrated in the exemplary subprocess flow of FIG. 11. After Subprocess 1 has been completed, at S1405 the index i is set to 1. Then, at S1406, Subprocess 2 is executed in which the task of reading a partial sum for each ADCF and latching new bits is performed. The details of Subprocess 2 are illustrated in the exemplary subprocess flow of FIG. 12. After Subprocess 2 has been completed, the index i is checked to determine if it is equal to M−1 at S1407. If i is not equal to M−1, the index i is incremented by one at S1408 and subsequently S1406 and S1407 are repeated. If i is equal to M−1, then at S1409 Subprocess 4 is executed. As compared with Subprocess 2, Subprocess 4 does not include the operations to latch new bits for each ADCF because the process for each ADCF is stopped after an output sample is calculated.

Figure 15:
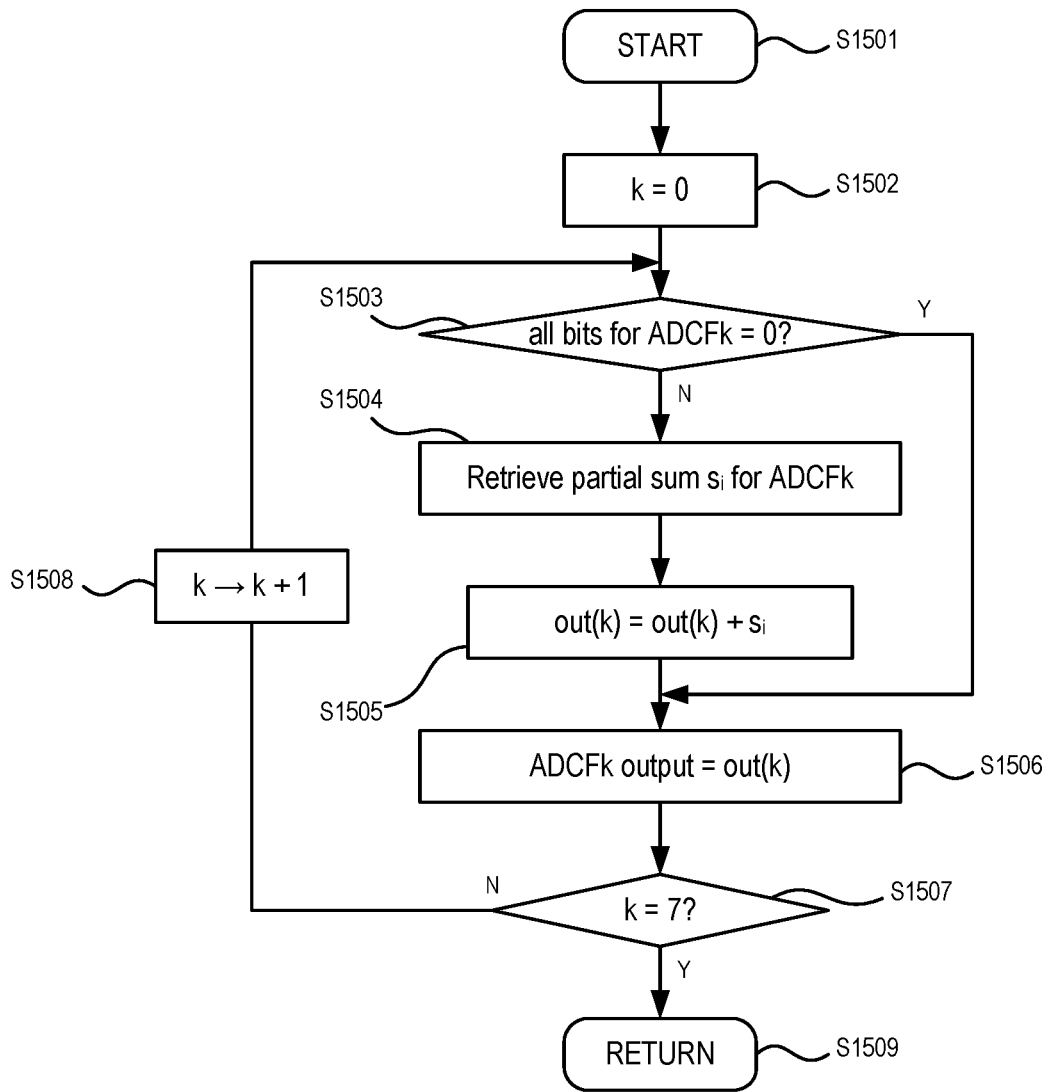
FIG. 15 illustrates an exemplary subprocess flow in the exemplary process flow according to FIG. 14.

As illustrated in FIG. 15, the subprocess begins at S1501. At S1502, an index k is initialized to 0. At S1503, the bits for ADCFk are checked to determine if all bits are zero. If any one of the bits is nonzero, a partial sum $s_i$ for ADCFk is retrieved at S1504. At S1505, the partial sum value for ADCFk is added to the temporary output variable out(k). If all of the bits are zero at S1503, the processing skips S1504 and S1505. In either case, at S1506 the output of ADCFk is set to the value of the temporary output variable out(k) and is transferred to the output. At S1507, the index k is checked to determine if it is equal to 7. If it is not equal to 7, the index k is incremented by 1 at S1508 and subsequently S1503 to S1507 are repeated. If k is equal to 7, then at S1509 Subprocess 4 terminates and control returns to the process flow of FIG. 14, which terminates at S1410. As noted above, if further samples from each ADCF are required, it is possible to either execute the process flow of FIG. 10 instead of the process flow of FIG. 14, or to execute the process flow of FIG. 14 multiple times.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An analog-to-digital converter, comprising:
   a sigma-delta modulator including an integrator; and
   an ADC filter having a width of N bits and including a latch circuit configured to store N+1 bits, the ADC filter configured to:
      store a plurality of partial sums as respective entries in a plurality of lookup tables,
      retrieve at least one of the plurality of partial sums based on an output of the sigma-delta modulator, and
      calculate a filter output by adding retrieved ones of the plurality of partial sums together,
   wherein N is a positive integer.

2. The analog-to-digital converter according to claim 1, wherein respective ones of the plurality of lookup tables have the same size.

3. The analog-to-digital converter according to claim 1, wherein respective ones of the plurality of lookup tables have different sizes.

4. The analog-to-digital converter according to claim 1, wherein a respective lookup table of the plurality of lookup tables includes at least one multiplexer and at least one adder.

5. The analog-to-digital converter according to claim 1, wherein the latch circuit includes a double latch and N−1 single latches.

6. An image sensor, comprising:
   a plurality of pixel circuits arranged in an array; and
   the analog-to-digital converter according to claim 1.

7. An analog-to-digital conversion circuit, comprising:
   a plurality of sigma-delta modulators respectively including an integrator; and
   a plurality of ADC filters respectively corresponding to the plurality of sigma-delta modulators, respectively having a width of N bits, and respectively including a latch circuit configured to store N+1 bits,
   wherein the plurality of ADC filters are respectively configured to:
      store a plurality of partial sums as respective entries in a plurality of lookup tables,
      retrieve at least one of the plurality of partial sums based on an output of the sigma-delta modulator, and
      calculate a filter output by adding retrieved ones of the plurality of partial sums together,
   wherein N is a positive integer.

8. The analog-to-digital conversion circuit according to claim 7, wherein respective ones of the plurality of lookup tables have the same size.

9. The analog-to-digital conversion circuit according to claim 7, wherein respective ones of the plurality of lookup tables have different sizes.

10. The analog-to-digital conversion circuit according to claim 7, wherein a respective lookup table of the plurality of lookup tables includes at least one multiplexer and at least one adder.

11. The analog-to-digital conversion circuit according to claim 7, wherein the plurality of ADC filters begin calculating in a time-sequential manner, such that a first ADC filter of the plurality of ADC filters begins at a first clock cycle and a second ADC filter of the plurality of ADC filters begins at a second clock cycle subsequent to the first clock cycle.

12. The analog-to-digital conversion circuit according to claim 7, wherein the respective latch circuit includes a double latch and N−1 single latches.

13. An image sensor, comprising:
   a plurality of pixel circuits arranged in an array; and
   the analog-to-digital conversion circuit according to claim 7.

14. A method of calculating an output in an analog-to-digital converter, comprising:
   storing, by an ADC filter having a width of N bits and including a latch circuit configured to store N+1 bits, a plurality of partial sums as respective entries in a plurality of lookup tables;
   receiving, by the ADC filter and from a sigma-delta modulator including an integrator, an output;
   retrieving, by the ADC filter, at least one of the plurality of partial sums based on the output; and
   adding, by the ADC filter, retrieved ones of the plurality of partial sums together so as to generate the output,
   wherein N is a positive integer.

15. The method according to claim 14, wherein respective ones of the plurality of lookup tables have the same size.

16. The method according to claim 14, wherein respective ones of the plurality of lookup tables have different sizes.

17. The method according to claim 14, wherein a respective lookup table of the plurality of lookup tables includes at least one multiplexer and at least one adder.

18. The method according to claim 14, comprising:
   beginning the adding by the ADC filter at a first clock cycle; and
   beginning an adding by another ADC filter at a second clock cycle subsequent to the first clock cycle.

19. The method according to claim 14, wherein the latch circuit includes a double latch and N−1 single latches.

20. The method according to claim 14, further comprising:
   receiving, at the sigma-delta modulator, an image signal from a pixel circuit; and
   generating, by the ADC filter, the output of the sigma-delta modulator based on the image signal.

* * * * *